US 011383272B2

(12) United States Patent
Rinner et al.

(10) Patent No.: US 11,383,272 B2
(45) Date of Patent: Jul. 12, 2022

(54) APPARATUS FOR PRODUCING HAPTIC FEEDBACK AND ELECTRONIC DEVICE

(71) Applicant: TDK Electronics AG, Munich (DE)

(72) Inventors: Franz Rinner, Deutschlandsberg (AT); Alexander Melischnig, Graz (AT)

(73) Assignee: TDK ELECTRONICS AG, Munich (DE)

(*) Notice: Subject to any disclaimer, the term of this patent is extended or adjusted under 35 U.S.C. 154(b) by 693 days.

(21) Appl. No.: 16/331,514

(22) PCT Filed: Sep. 6, 2017

(86) PCT No.: PCT/EP2017/072364
§ 371 (c)(1),
(2) Date: Mar. 7, 2019

(87) PCT Pub. No.: WO2018/046546
PCT Pub. Date: Mar. 15, 2018

(65) Prior Publication Data
US 2019/0210065 A1    Jul. 11, 2019

(30) Foreign Application Priority Data
Sep. 7, 2016   (DE) .......................... 102016116760.6

(51) Int. Cl.
*B06B 1/06*        (2006.01)
*G06F 3/01*        (2006.01)
(Continued)

(52) U.S. Cl.
CPC .......... *B06B 1/0603* (2013.01); *B06B 1/0611* (2013.01); *G06F 3/016* (2013.01);
(Continued)

(58) Field of Classification Search
CPC combination set(s) only.
See application file for complete search history.

(56) References Cited

U.S. PATENT DOCUMENTS

| 4,976,553 A | 12/1990 | Yamaguchi et al. |
| 5,729,077 A | 3/1998 | Newnham et al. |

(Continued)

FOREIGN PATENT DOCUMENTS

| CN | 102195514 A | 9/2011 |
| CN | 102804104 A | 11/2012 |

(Continued)

OTHER PUBLICATIONS

"Precision Haptic—Haptic Feedback Vibration Motors," Precision Microdrives, downloaded from http://www.precisionmicrodrives.com/vibratingvibrator-vibration-motors/vibration-motorranges/precision-haptic-range on Apr. 3, 2019, 2 pages.

*Primary Examiner* — Bryan P Gordon
(74) *Attorney, Agent, or Firm* — Slater Matsil, LLP

(57) ABSTRACT

An apparatus for producing haptic feedback and an electronic device are disclosed. In an embodiment an apparatus includes a piezoelectric actuator and a mechanical structure, wherein the piezoelectric actuator is configured to modify its extension in a first direction, and wherein the mechanical structure is configured to deform as a result of a change in the extension of the piezoelectric actuator in such a way that an area of the mechanical structure is moved in relation to the piezoelectric actuator in a second direction which is perpendicular to the first direction.

20 Claims, 3 Drawing Sheets

(51) Int. Cl.
  *G10K 9/125* (2006.01)
  *H01L 41/047* (2006.01)
  *H01L 41/09* (2006.01)

(52) U.S. Cl.
  CPC .......... *G10K 9/125* (2013.01); *H01L 41/0471* (2013.01); *H01L 41/0933* (2013.01)

(56) References Cited

U.S. PATENT DOCUMENTS

| | | | |
|---|---|---|---|
| 7,324,094 B2 | 1/2008 | Moilanen et al. | |
| 8,502,433 B2 | 8/2013 | Zanella et al. | |
| 8,830,042 B2 | 9/2014 | Kim et al. | |
| 9,690,412 B2 | 6/2017 | Tissot | |
| 9,735,339 B2 | 8/2017 | Lönnberg et al. | |
| 9,921,654 B2 | 3/2018 | Hashimoto et al. | |
| 2005/0242687 A1* | 11/2005 | Kawakubo | H01L 41/0933 310/324 |
| 2007/0177747 A1* | 8/2007 | Onishi | H04R 17/00 381/191 |
| 2011/0216027 A1 | 9/2011 | Kim et al. | |
| 2012/0206248 A1 | 8/2012 | Biggs | |
| 2014/0292144 A1 | 10/2014 | Son et al. | |
| 2014/0346926 A1* | 11/2014 | Choi | H01L 41/0933 310/323.01 |
| 2015/0321222 A1 | 11/2015 | Kim et al. | |
| 2015/0333699 A1* | 11/2015 | Kim | H03B 5/32 345/173 |
| 2016/0023245 A1* | 1/2016 | Zadesky | H01L 41/0973 310/334 |
| 2016/0027263 A1 | 1/2016 | Parker et al. | |
| 2017/0228020 A1 | 8/2017 | Hashimoto | |

FOREIGN PATENT DOCUMENTS

| | | |
|---|---|---|
| CN | 103176600 A | 6/2013 |
| CN | 103842938 A | 6/2014 |
| CN | 104396040 A | 3/2015 |
| DE | 3841416 A1 | 7/1989 |
| DE | 202008017833 U1 | 8/2010 |
| EP | 3056977 A1 | 8/2016 |
| JP | 2002321700 A | 11/2002 |
| KR | 100621706 B1 | 11/2006 |
| WO | 2005087392 A1 | 9/2005 |
| WO | 2014164018 A1 | 10/2014 |
| WO | 2016067831 A1 | 5/2016 |

* cited by examiner

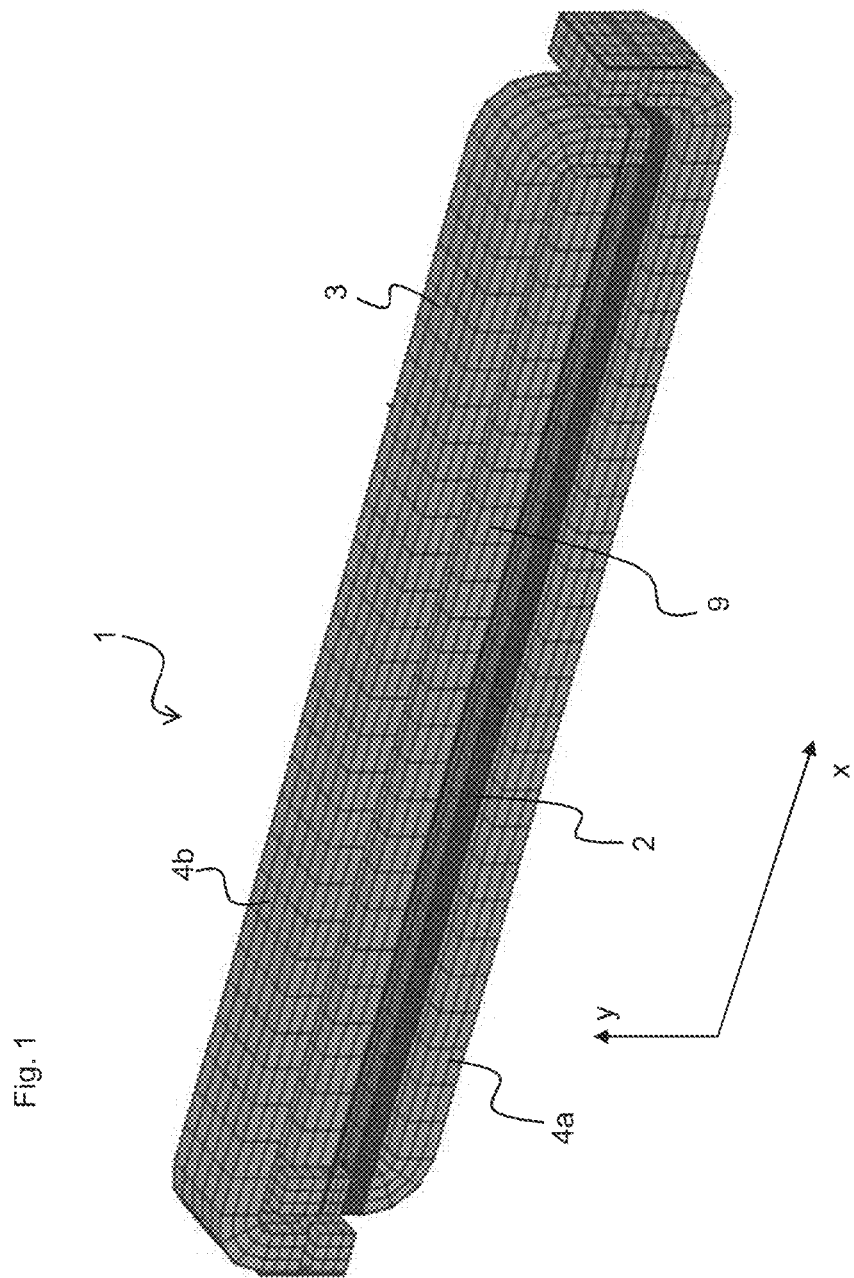

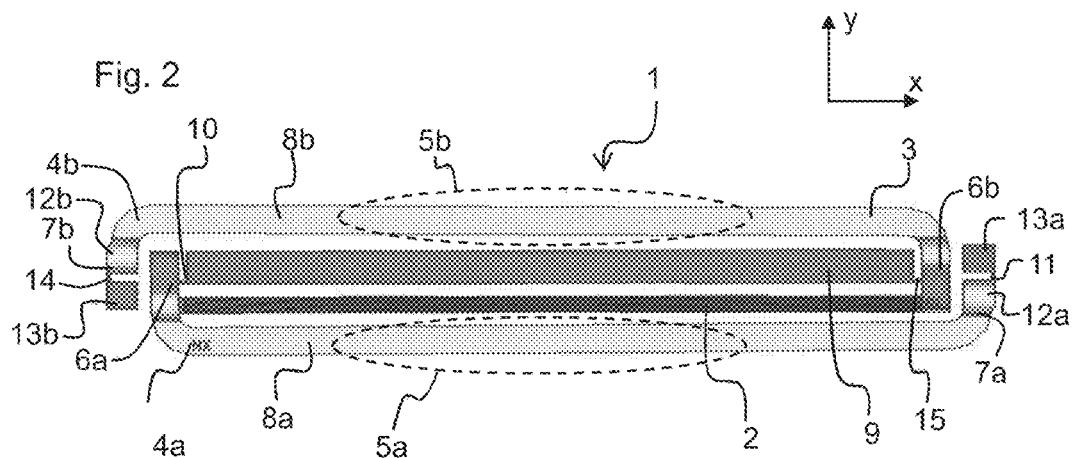
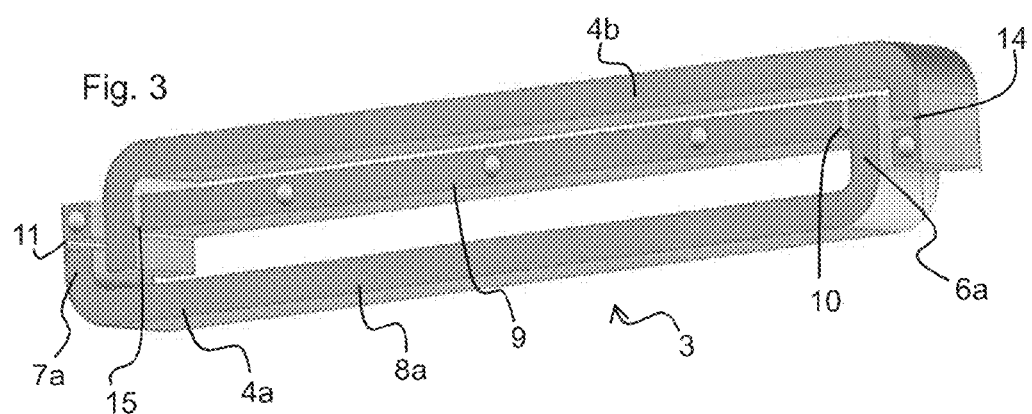
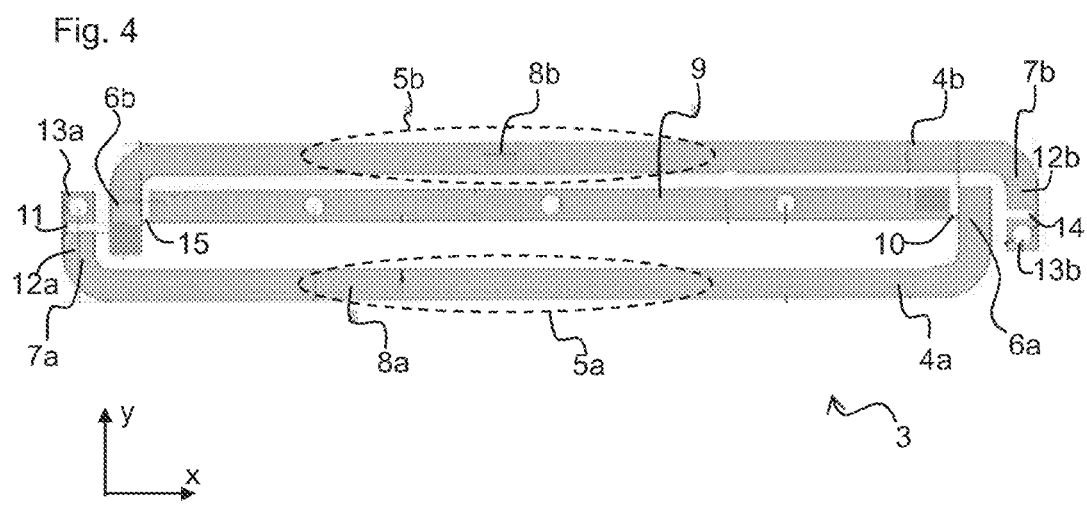

APPARATUS FOR PRODUCING HAPTIC FEEDBACK AND ELECTRONIC DEVICE

This patent application is a national phase filing under section 371 of PCT/EP2017/072364, filed Sep. 6, 2017, which claims the priority of German patent application 102016116760.6, filed Sep. 7, 2016, each of which is incorporated herein by reference in its entirety.

TECHNICAL FIELD

The present invention relates to an apparatus for producing haptic feedback and an electronic device which comprises an apparatus of this type. In various electronic devices, such as, for example, touch-sensitive screens, artificially produced haptic feedback is desired which simulates a natural keypress. Further applications, for example, game consoles, similarly make use of vibration modules which produce haptic feedback. In devices of this type the space available is often very limited, so that the haptic feedback should be produced with the smallest possible apparatus.

BACKGROUND

The use of a piezoelectric actuator as a drive for an apparatus for producing haptic feedback is known from U.S. Patent Application Publication No. 2014/0292144 A1.

SUMMARY OF THE INVENTION

Embodiments provide an improved apparatus for producing haptic feedback.

Embodiments provide an apparatus for producing haptic feedback which has a piezoelectric actuator and a mechanical structure, wherein the piezoelectric actuator is designed to modify its extension in a first direction, and wherein the mechanical structure is designed to deform as a result of a change in the extension of the piezoelectric actuator in such a way that an area of the mechanical structure is moved in relation to the piezoelectric actuator in a second direction which is perpendicular to the first direction.

The mechanical structure can be designed to transfer a change in the extension of the piezoelectric actuator into a movement of the area in the second direction. The area may be the area of the mechanical structure which undergoes the greatest movement as a result of the change in the extension of the piezoelectric actuator. Other areas of the mechanical structure can also be deformed as a result of the change in the extension of the piezoelectric actuator. These other areas can undergo a movement whose movement amplitude is less than the movement of the area.

The haptic feedback can be produced by the movement of the area. For this purpose, weights or housing elements, for example, such as, e.g., a cover or a baseplate, can be fixed to the area. These weights or housing elements can follow a movement of the area. A vibration which a user perceives as haptic feedback can be produced by the movement of the area.

The mechanical structure can thus enable the movement of the piezoelectric actuator to be translated in a second direction perpendicular to the extension of the piezoelectric actuator. The apparatus can have a smaller extension in the second direction than in the first direction. The haptic feedback or vibration can act accordingly in a direction in which the apparatus is very flat. Such a flat shape of the apparatus can be advantageous for installation in an electronic device.

The piezoelectric actuator may be a multi-layer component in which internal electrodes and piezoelectric layers are stacked alternately above one another in a stacking direction. The stacking direction can be parallel to a first direction. The piezoelectric actuator can be designed to change its extension in the first direction as a result of a voltage applied to the internal electrodes. The piezoelectric actuator can expand or contract. In the case of an expansion, the length of the actuator is increased in the first direction. In the case of a contraction, the length of the actuator is reduced in the first direction. The actuator can be designed in such a way that it changes its extension constantly as a result of an AC voltage applied to the internal electrodes, whereby a vibration is produced.

The mechanical structure may comprise steel or bronze. In particular, the mechanical structure can be made from steel or bronze. The mechanical structure may be a single piece.

The mechanical structure can be designed so that, as a result of a change in the extension of the piezoelectric actuator, the area of the mechanical structure is moved in the second direction by a distance which is at least ten times greater than the change in the extension of the piezoelectric actuator in the first direction. The distance is preferably at least 20 times greater than the change in the extension of the piezoelectric actuator. The mechanical structure can accordingly enable a lift translation for the change in the extension of the piezoelectric actuator of at least 1:10, preferably of at least 1:20. The mechanical structure can accordingly ensure an increase in the movement amplitude. The mechanical structure can accordingly substantially increase the produced vibrations or the produced haptic feedback which can be produced by the piezoelectric actuator.

The mechanical structure can have a substructure which is designed not to move in the second direction in relation to the piezoelectric actuator as a result of a change in the extension of the piezoelectric actuator. The haptic feedback can be produced by a relative movement of the area in relation to the substructure. The substructure can act as a counterhold in relation to the piezoelectric actuator. In particular, a lever arm which has the area can be connected to the piezoelectric actuator and the substructure in such a way that an extension of the piezoelectric actuator results in a rotation of the lever arm around a pivot which is formed by a connection point of the substructure and the lever arm.

The substructure can extend in the first direction in the form of a bar, wherein the substructure is arranged parallel to the piezoelectric actuator.

The mechanical structure can have a first lever arm which has the area, wherein a first end of the piezoelectric actuator is fixed to the first lever arm. The position of the lever arm to which the actuator is attached can be moved in the first direction in the event of a change in the extension of the piezoelectric actuator. The piezoelectric actuator can be connected to the first lever arm, for example, by clamping, adhesion or soldering.

The first lever arm can be movably connected to the substructure. The first lever arm and the substructure may be one piece and may be flexibly interconnected via a thin area. Alternatively, the first lever arm and the substructure may be a plurality of pieces and may be movably interconnected via a joint. Since the first lever arm is movable in relation to the substructure, the entire mechanical structure is intrinsically movable and can be deformed in this way. The first lever arm and the substructure can be designed so that the movements or deformations are always performed elastically.

The first lever arm can have a first end section, a second end section and a mid-section. The end sections can be parallel to one another. The mid-section can interconnect the two end sections and can be perpendicular to the two end sections. The first lever arm can accordingly be U-shaped. The mid-section can be longer than the first end section and longer than the second end section. The mid-section can be arranged parallel to the piezoelectric actuator. The piezoelectric actuator can be arranged between the two end sections.

The area which is designed to be moved in the second direction in the event of a deformation of the mechanical structure can be arranged in the mid-section. In particular, in the event of a deformation of the first lever arm, the mid-section can be the section which undergoes the greatest change in its position. The lever arm can be designed, for example, in such a way that the two end sections are either pushed apart or drawn together as a result of a change in the extension of the piezoelectric actuator, whereby the mid-section becomes arched.

The first end section can be movably attached to the substructure and one end of the piezoelectric actuator can be fixed to the first end section.

The second end section can have a thin area which subdivides the second end section into a first subsection and a second subsection which are flexible in relation to one another, wherein the first subsection adjoins the mid-section and wherein the second subsection is designed to be fixed to an attachment apparatus. The attachment apparatus is not part of the apparatus for producing the haptic feedback. The attachment apparatus may be part of an electronic device which has the apparatus for producing the haptic feedback.

The mechanical structure can have a second lever arm which has an area which is designed to move in the second direction in the event of a deformation of the mechanical structure as a result of a change in the extension of the piezoelectric actuator. A second end of the piezoelectric actuator can be fixed to the second lever arm. The lever arms can be designed in such a way that the area of the first lever arm and the area of the second lever arm are always moved in the same direction. Each of the lever arms can have a first end section and a second end section which in each case have a thin area, wherein the thin areas lie in one plane. It can thereby be ensured that the mechanical structure is prevented from becoming jammed or mechanically blocked.

The second lever arm can be designed in such a way that its two end sections are either pushed apart or drawn together as a result of a change in the extension of the piezoelectric actuator, whereby the mid-section becomes arched.

The mechanical structure can have a plurality of parts. The apparatus can have a holding apparatus which is designed to exert a force from outside on the mechanical structure, by means of which the mechanical structure is held together.

The piezoelectric actuator can have a multi-layer structure in which internal electrodes and piezoelectric layers are arranged alternately above one another in a stacking direction, wherein the first direction is parallel to the stacking direction.

The present invention furthermore relates to an electronic device which has the above-mentioned apparatus and a first housing element and a second housing element. The first and the second housing elements are attached to the mechanical structure in such a way that the housing elements are moved in relation to one another in the event of a change in the extension of the piezoelectric actuator in the first direction.

The second housing element can, for example, be attached to the substructure which is not moved in the second direction in relation to the piezoelectric actuator, and the second housing element can be attached to the area of the mechanical structure which is moved in the second direction as a result of a change in the extension of the piezoelectric actuator.

The electronic device may, for example, be a screen, in particular a touch-sensitive screen. The electronic device may be a control unit of game console.

BRIEF DESCRIPTION OF THE DRAWINGS

The invention will be explained in more detail below by way of the figures.

FIGS. 1 and 2 show an apparatus for producing haptic feedback;

FIGS. 3 and 4 show a mechanical structure; and

DETAILED DESCRIPTION OF ILLUSTRATIVE EMBODIMENTS

Figure 5:
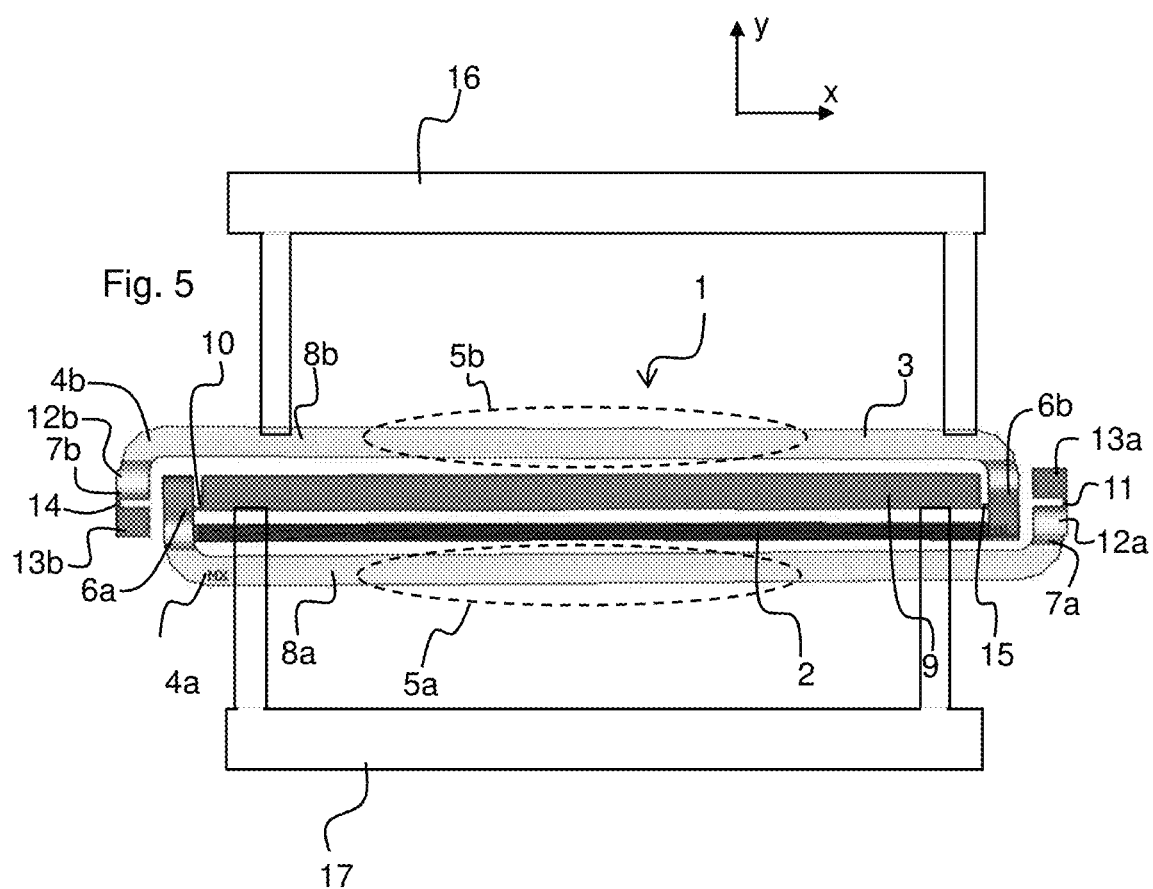
FIG. 5 shows an apparatus for producing haptic feedback with housing elements.

FIGS. 1 and 2 show an apparatus 1 for producing haptic feedback. FIG. 1 shows the apparatus 1 in a top view. FIG. 2 shows the apparatus 1 in a cross section.

The apparatus 1 has a piezoelectric actuator 2 and a mechanical structure 3 which is designed to translate a change in the length of the piezoelectric actuator 2 into a mechanical movement with an increased extent of movement. The piezoelectric actuator 2 is a multi-layer component which is designed to vibrate in a stacking direction in which internal electrodes and piezoelectric layers are stacked alternately above one another. The stacking direction is parallel to a first direction x. The piezoelectric actuator 2 is designed to change its extension in the first direction x as a result of an electric voltage applied to the internal electrodes, wherein the piezoelectric actuator 2 expands and contracts alternately.

FIG. 3 shows the mechanical structure 3 in a top view. FIG. 4 shows the mechanical structure 3 in a cross section.

The mechanical structure 3 has a first lever 4a and a second lever arm 4b. The mechanical structure 3 is designed in such a way it deforms as a result of a change in the extension of the piezoelectric actuator 2 in such a way that an area 5a of the first lever arm 4a and an area 5b of the second lever arm 4b are moved in each case in a second direction y. The second direction y is perpendicular to the first direction x. The mechanical structure 3 is, in particular, shaped in such a way that the areas 5a, 5b of the first and the second lever arm 4a, 4b move by a distance which is greater than the change in length of the piezoelectric actuator 2 in the first direction x. The distance by which the areas 4a, 4b of the first and second lever arm 5a, 5b are moved can, for example, be at least ten times greater than the change in the extension of the piezoelectric actuator 2. The mechanical structure 3 can accordingly enable a lift translation of 1:10.

The first lever arm 4a will first be examined more closely below. The first lever arm 4a is U-shaped. The first lever arm 4a has a first end section 6a and a second end section 7a which are arranged parallel to one another. The first lever arm 4a furthermore has a mid-section 8a which is perpendicular to the first and the second end section 6a, 7a and which interconnects the two end sections 6a, 7a. The area 5a which undergoes the greatest movement in the second direction y as a result of a change in the extension of the piezoelectric actuator 2 is arranged in the mid-section 8a of the first lever arm 4a.

The mechanical structure 3 furthermore has a substructure 9 which is designed not to move as a result of a change in the extension of the piezoelectric actuator 2. This substructure 9 serves as a counterhold to the piezoelectric actuator 2. It forms a fixed point in relation to which the piezoelectric actuator 2 and the lever arms 4a, 4b can move. The substructure 9 is bar-shaped. The substructure 9 is arranged parallel to the piezoelectric actuator 2. The substructure 9 runs at a distance of less than 1 mm parallel to the piezoelectric actuator 2.

The substructure 9 and the first lever arm 4a are formed as one piece. The substructure 9 and the first lever arm 4a are interconnected via a first thin area 10. The first lever arm 4a can be moved in relation to the substructure 9 by bending the thin area 10. The first thin area 10 is designed to deform elastically when bent. The first thin area 10 represents a pivot around which the first lever arm 4a can be rotated in relation to the substructure 9. The first lever arm 4a is thus movably fixed to the substructure 9. The piezoelectric actuator 2 is furthermore attached to the first lever arm 4a. The piezoelectric actuator 2 can be attached to the first lever arm 4a in a non-detachable manner, for example, by clamping, adhesion, soldering or other attachment methods.

The substructure 9 and the piezoelectric actuator 2 are connected in each case to the first end section 6a of the first lever arm 4a. The substructure 9 is movably connected to the first end section 6a. The piezoelectric actuator 2 is fixed to the first end section 4a in such a way that the first end section 4a is moved by an expansion or contraction of the piezoelectric actuator 2. The piezoelectric actuator 2 is attached at a position on the first end section 4a which is closer to the mid-section 8a than the position of the first end section 4a to which the substructure 9 is attached.

The first lever arm 4a furthermore has the second end section 7a. The second end section 7a is subdivided by a second thin area 11 into two subsections 12a, 13a. A first subsection 12a of the second end section 7a directly adjoins the mid-section 8a. A second subsection 13a of the second end section 7a is arranged on the side of the second end section 7a facing away from the mid-section 8a. The second thin area 11 enables the two subsections 12a, 13a of the second end section 7a to be moved in relation to one another. In particular, the second end section 7 can be bent at the second thin area 11. The second subsection 13a is designed to be fixed to an external attachment apparatus.

The case will now be examined where the piezoelectric actuator 2 extends in the first direction x as a result of an applied voltage. In this case, the first thin area 10 between the substructure 9 and the first end section 6a of the first lever arm 4a is bent. The piezoelectric actuator 2 pushes the first end section 6a in the first direction x. As a result, the first end section 6a is bent around the first thin area 10 as a pivot. If the second sub-area 13a of the second end section 7a is fixed to the attachment apparatus, it cannot accordingly follow the movement. The second end section 7a is therefore bent at its thin area 11 in order to compensate for the rotational movement of the first end section 6a. The first subsection 12a of the second end section 7a moves in relation to the second subsection 13a of the second end section 7a. This is accompanied by an arching of the mid-section 8a. In particular, the mid-section 8a is moved in the second direction y. In the representation shown in FIGS. 1 and 2, the mid-section 8a is bent downward. The marked area 5a undergoes a particularly substantial movement.

The mechanical structure 3 furthermore has the second lever arm 4b. The second lever arm 4b has an identical structure to the first lever arm 4a. The second lever arm 4b also has a first end section 6b which is movably connected to the substructure 9 and is fixed to the piezoelectric actuator 2, a mid-area 8b and a second end section 7b which is subdivided by a third thin area 14 into two subsections 12b, 13b. The substructure 9 and the piezoelectric actuator 2 are connected to the second lever arm 4b in such a way that the area 5b of the second lever arm 4b which undergoes a maximum position change as a result of the extension of the piezoelectric actuator 2 always moves in the same direction as the area 5a of the first lever arm 4a. To do this, the piezoelectric actuator 2 is fixed to the second lever arm 4b at a position on the first end section 6b which is further away from the mid-section 8b than the position at which the substructure 9 is connected to the second lever arm 4b. It is thereby ensured that the first end section 6b of the second lever arm 4b is rotated in the same rotational direction as the first end section 6a of the first lever arm 4a. The first end section 6b of the second lever arm 4b is connected to the substructure 9 via a fourth thin area 15.

In the example embodiment shown in FIGS. 1 and 2, the areas 5a, 5b of the mid-sections 8a, 8b of the first and of the second lever arm 4a, 4b, as discussed above, move downward as a result of an expansion of the piezoelectric actuator 2. The areas 5a, 5b move downwards as a result of a contraction of the piezoelectric actuator 2.

In an alternative example embodiment, the mechanical structure 3 can have a plurality of parts. In this case, one or more of the thin areas 10, 11, 14, 15 can be replaced by joints at which a relative movement of the first end section 6a, 6b of the respective lever arm 4a, 4b in relation to the substructure 9 or a movement of the first subsection 12a, 12b in relation to the second subsection 13a, 13b of the second end sections 7a, 7b is enabled. In this case, the apparatus 1 can furthermore have elements which are designed to exert a force from outside on the mechanical structure 3 in order to hold the latter together. This may involve, for example, springs.

The four thin areas 10, 11, 14, 15 which act as pivots are arranged in one plane. It can thereby be ensured that a jamming of the mechanical structure 3 is prevented and the distance between the outer attachment apparatuses can be kept constant. The four thin areas 10, 11, 14, 15 are also regarded as lying in one plane insofar as they are arranged at a maximum distance of 1 mm from the plane. An arrangement of one of the thin areas 10, 11, 14, 15 offset by less than 1 mm away from the plane does not result in a jamming of the mechanical structure 3.

The haptic feedback is now produced by a relative movement between the substructure 9 and the lever arms 4a, 4b. Housing elements 16, 17 of an electronic device can, for example, be attached to the substructure 9 and the lever arms 4a, 4b. The housing elements 16, 17 may, for example, be a baseplate, a cover or weights. They can be fixed to the substructure 9 and the lever arms 4a, 4b by screw connections or other connections. If a housing element 16, 17 attached to the substructure 9 is now moved in relation to a housing element attached to one of the lever arms 4a, 4b, haptic feedback which a user of the electronic device perceives is thereby produced.

The invention claimed is:
1. An apparatus for producing haptic feedback comprising:
a piezoelectric actuator; and
a mechanical structure, wherein the piezoelectric actuator is configured to modify its extension in a first direction, wherein the mechanical structure is configured to deform as a result of a change in the extension of the piezoelectric actuator in such a way that an area of the mechanical structure is moved in relation to the piezoelectric actuator in a second direction which is perpendicular to the first direction, wherein the mechanical structure has a substructure which is configured not to move in the second direction in relation to the piezoelectric actuator as the result of the change in the extension of the piezoelectric actuator in the first direction, wherein a movement of the area in relation to the substructure is configured to produce a haptic signal, wherein the substructure extends in the first direction in form of a bar, and wherein the substructure overlaps with the piezoelectric actuator.

2. The apparatus according to claim 1, wherein the mechanical structure is designed so that the area of the mechanical structure is moved in the second direction by a distance which is at least ten times greater than the change in the extension of the piezoelectric actuator in the first direction.

3. The apparatus according to claim 1, wherein the substructure is arranged parallel to the piezoelectric actuator.

4. The apparatus according to claim 1,
wherein the mechanical structure has a first lever arm which comprises the area,
wherein a first end of the piezoelectric actuator is fixed to the first lever arm, and
wherein the first lever arm is movably connected to the substructure.

5. The apparatus according to claim 4,
wherein the first lever arm and the substructure are one piece and are flexibly interconnected via a thin area, or
wherein the first lever arm and the substructure are a plurality of pieces and are movably interconnected via a joint.

6. The apparatus according to claim 1,
wherein the mechanical structure has a first lever arm which comprises the area, and
wherein a first end of the piezoelectric actuator is fixed to the first lever arm.

7. The apparatus according to claim 6,
wherein the first lever arm has a first end section, a second end section and a mid-section,
wherein the end sections are parallel to one another,
wherein the mid-section interconnects the two end sections and is perpendicular to the two end sections, and
wherein the area which is configured to be moved in the second direction in an event of a deformation of the mechanical structure is arranged in the mid-section.

8. The apparatus according to claim 7, wherein the first lever arm is configured so that the two end sections are either pushed apart or drawn together as the result of the change in the extension of the piezoelectric actuator, and wherein the mid-section becomes arched.

9. The apparatus according to claim 7,
wherein the first end section is movably attached to the substructure, and
wherein one end of the piezoelectric actuator is fixed to the first end section.

10. The apparatus according to claim 7,
wherein the second end section has a thin area which subdivides the second end section into a first subsection and a second subsection which are flexible in relation to one another,
wherein the first subsection adjoins the mid-section, and
wherein the second subsection is configured to be fixed to an attachment apparatus.

11. The apparatus according to claim 6,
wherein the mechanical structure has a second lever arm which comprises an area which is configured to move in the second direction in an event of a deformation of the mechanical structure as the result of the change in the extension of the piezoelectric actuator,
wherein a second end of the piezoelectric actuator is fixed to the second lever arm, and
wherein the lever arms are designed in such a way that the area of the first lever arm and the area of the second lever arm are always moved in the same direction.

12. The apparatus according to claim 11,
wherein each of the lever arms has a first end section and a second end section,
wherein the second end sections in each case have a thin area,
wherein the first end sections are connected in each case via a thin area to the substructure, and
wherein the thin areas lie in one plane.

13. The apparatus according to claim 1,
wherein the mechanical structure has a plurality of parts, and
wherein the apparatus has a holding apparatus which is designed to exert a force from outside on the mechanical structure, by which the mechanical structure is held together.

14. The apparatus according to claim 1,
wherein the piezoelectric actuator has a multi-layer structure in which internal electrodes and piezoelectric layers are arranged alternately above one another in a stacking direction, and
wherein the first direction is parallel to the stacking direction.

15. An electronic device comprising:
an apparatus configured to produce a haptic feedback, the apparatus comprising:
a piezoelectric actuator; and
a mechanical structure,
wherein the piezoelectric actuator is configured to modify its extension in a first direction, and
wherein the mechanical structure is configured to deform as a result of a change in the extension of the piezoelectric actuator in such a way that an area of the mechanical structure is moved in relation to the piezoelectric actuator in a second direction which is perpendicular to the first direction;
a first housing element; and
a second housing element,
wherein the first housing element and the second housing element are attached to the mechanical structure in such a way that the housing elements are moved in relation to one another in an event of the change in the extension of the piezoelectric actuator in the first direction, and
wherein substructure of the mechanical structure overlaps with the piezoelectric actuator.

16. The electronic device according to claim 15, wherein the substructure is configured to not move in the second direction in relation to the piezoelectric actuator as the result of the change in the extension of the piezoelectric actuator, and wherein the haptic feedback is produced by a movement of the area in relation to the substructure.

17. The electronic device according to claim 16, wherein the substructure extends in the first direction in form of a bar.

18. The electronic device according to claim 16, wherein the substructure is arranged parallel to the piezoelectric actuator.

19. The electronic device according to claim 16,
wherein the mechanical structure has a first lever arm which comprises the area,
wherein a first end of the piezoelectric actuator is fixed to the first lever arm, and
wherein the first lever arm is movably connected to the substructure.

20. An apparatus for producing haptic feedback comprising:
a piezoelectric actuator; and
a mechanical structure,
wherein the piezoelectric actuator is configured to modify its extension in a first direction,
wherein the mechanical structure is configured to deform as a result of a change in the extension of the piezoelectric actuator in such a way that an area of the mechanical structure is moved in relation to the piezoelectric actuator in a second direction which is perpendicular to the first direction,
wherein the mechanical structure has a first lever arm which comprises the area, and
wherein a first end of the piezoelectric actuator is fixed to the first lever arm.

* * * * *